US012772762B2

(12) United States Patent
Kaneko et al.

(10) Patent No.: US 12,772,762 B2
(45) Date of Patent: Oct. 20, 2026

(54) SUBSTRATE PROCESSING METHOD AND SUBSTRATE PROCESSING APPARATUS

(71) Applicant: Tokyo Electron Limited, Tokyo (JP)

(72) Inventors: Miyako Kaneko, Nirasaki City (JP); Naoko Suzuki, Nirasaki City (JP)

(73) Assignee: Tokyo Electron Limited, Tokyo (JP)

( * ) Notice: Subject to any disclaimer, the term of this patent is extended or adjusted under 35 U.S.C. 154(b) by 429 days.

(21) Appl. No.: 18/546,140

(22) PCT Filed: Feb. 14, 2022

(86) PCT No.: PCT/JP2022/005752
§ 371 (c)(1),
(2) Date: Aug. 11, 2023

(87) PCT Pub. No.: WO2022/176815
PCT Pub. Date: Aug. 25, 2022

(65) Prior Publication Data

US 2024/0304436 A1 Sep. 12, 2024

(30) Foreign Application Priority Data

Feb. 22, 2021 (JP) ................................ 2021-026704

(51) Int. Cl.
*H10P 14/69* (2026.01)
*C23C 16/26* (2006.01)
(Continued)

(52) U.S. Cl.
CPC .......... *H10P 14/6902* (2026.01); *C23C 16/26* (2013.01); *C23C 16/45529* (2013.01);
(Continued)

(58) Field of Classification Search
CPC ................ H10P 14/6902; C23C 16/26; C23C 16/45529; C23C 16/45544;
(Continued)

(56) References Cited

U.S. PATENT DOCUMENTS 5,837,331 A * 11/1998 Menu .................... C23C 14/548 427/78
2007/0077777 A1* 4/2007 Gumpher ............ H01L 21/0234 257/E21.268
2009/0299467 A1* 12/2009 Kill ....................... A61L 27/303 427/2.24
2010/0260994 A1* 10/2010 Groenen ................ C23C 16/26 427/446
(Continued)

FOREIGN PATENT DOCUMENTS

JP H03-199376 A 8/1991
JP 2010-265123 A 11/2010
(Continued)

*Primary Examiner* — Mohammed Shamsuzzaman
(74) *Attorney, Agent, or Firm* — Armstrong Teasdale LLP

(57) ABSTRACT

Provided are a substrate processing method and a substrate processing apparatus that improve an etching resistance and suppress a film stress. A substrate processing method of forming a carbon-based film on a substrate includes: a process of placing the substrate on a stage; a first film forming process of forming a first carbon-based film having a first stress; a second film forming process of forming a second carbon-based film having a second stress; and a third film forming process of repeating the first film forming process and the second film forming process to form a stacked body of the first carbon-based film and the second carbon-based film, wherein the first stress and the second stress are oriented in a same direction, and the first stress and the second stress have different intensities.

18 Claims, 8 Drawing Sheets

(51) Int. Cl.

| | |
|---|---|
| ***C23C 16/455*** | (2006.01) |
| ***C23C 16/458*** | (2006.01) |
| ***C23C 16/505*** | (2006.01) |
| ***C23C 16/52*** | (2006.01) |

(52) U.S. Cl.
CPC .... *C23C 16/45544* (2013.01); *C23C 16/4586* (2013.01); *C23C 16/505* (2013.01); *C23C 16/52* (2013.01)

(58) Field of Classification Search
CPC ... C23C 16/4586; C23C 16/505; C23C 16/52; H01L 21/02115; H01L 21/02274; H01L 21/2015; H01L 21/022; H01L 21/0332
See application file for complete search history.

(56) References Cited

U.S. PATENT DOCUMENTS

| | | | | |
|---|---|---|---|---|
| 2019/0181004 | A1* | 6/2019 | Tang | H01L 21/76224 |
| 2019/0293850 | A1* | 9/2019 | Chiao | C23C 16/272 |

FOREIGN PATENT DOCUMENTS

| | | | | | |
|---|---|---|---|---|---|
| JP | 2017-504209 | A | | 2/2017 | |
| JP | 2017-507477 | A | | 3/2017 | |
| JP | 2017128491 | A | * | 7/2017 | G02B 1/113 |
| KR | 20150024744 | A | * | 3/2015 | C01B 32/05 |
| KR | 10-2021-0011945 | A | | 2/2021 | |
| WO | WO-2009080610 | A1 | * | 7/2009 | C23C 16/26 |
| WO | 2020197866 | A1 | | 10/2020 | |

* cited by examiner

SUBSTRATE PROCESSING METHOD AND SUBSTRATE PROCESSING APPARATUS

CROSS-REFERENCE TO RELATED APPLICATIONS

The present application is a U.S. National Stage Entry of International Patent Application No. PCT/JP2022/005752, filed Feb. 14, 2022, which claims the benefit of priority to Japanese Patent Application No. 2021-026704, filed Feb. 22, 2021, each of which is hereby incorporated herein by reference in its entirety.

TECHNICAL FIELD

The present disclosure relates to a substrate processing method and a substrate processing apparatus.

BACKGROUND

For example, use of a hard mask containing carbon as an etching mask is known.

Patent Document 1 discloses a method of forming an amorphous carbon layer, which includes depositing an amorphous carbon layer on a base layer, patterning the amorphous carbon layer, etching at least a portion of the amorphous carbon layer, implanting a dopant into the amorphous carbon layer by a tilt process; and etching the base layer.

PRIOR ART DOCUMENT

Patent Document

Patent Document 1: Japanese Patent Laid-Open Publication No. 2017-507477.

SUMMARY

In an aspect, the present disclosure provides a substrate processing method and a substrate processing apparatus that improve an etching resistance and suppress a film stress.

In order to solve the above-mentioned problem, an embodiment of the present disclosure provides a substrate processing method of forming a carbon-based film on a substrate, the method including: a process of placing the substrate on a stage; a first film forming process of forming a first carbon-based film having a first stress; a second film forming process of forming a second carbon-based film having a second stress; and a third film forming process of repeating the first film forming process and the second film forming process to form a stacked body of the first carbon-based film and the second carbon-based film, wherein the first stress and the second stress are oriented in the same direction, and the first stress and the second stress have different intensities.

According to the aspect, it is possible to provide a substrate processing method and a substrate processing apparatus that improve an etching resistance and suppress a film stress.

DETAILED DESCRIPTION

Figure 1:
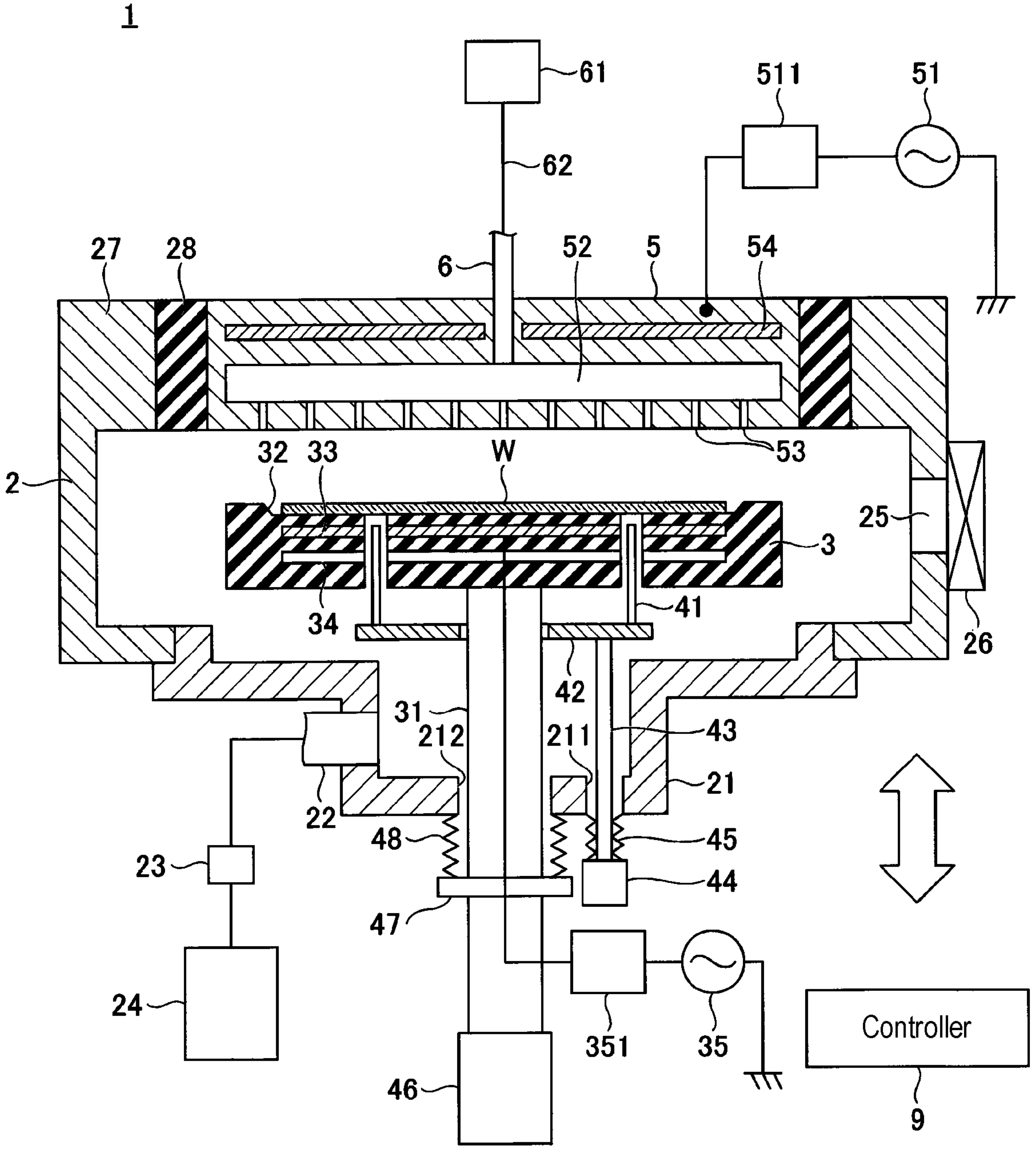
FIG. 1 is a schematic cross-sectional view illustrating an example of a processing apparatus according to an embodiment.

Hereinafter, embodiments of the present disclosure will be described with reference to the accompanying drawings. In each of the drawings, the same components may be denoted by the same reference numerals, and redundant descriptions thereof may be omitted.

[Processing Apparatus]

A substrate processing apparatus 1 according to an embodiment will be described with reference to FIG. 1. FIG. 1 is a schematic cross-sectional view illustrating an example of the substrate processing apparatus 1 according to the present embodiment. The substrate processing apparatus 1 is an apparatus for forming a carbon-based film (a stacked body 220 of carbon-based films to be described later with reference to FIG. 3) on a substrate W such as a wafer by a chemical vapor deposition (CVD) method in a processing container 2 in a depressurized state.

The substrate processing apparatus 1 includes the substantially cylindrical airtight processing container 2. An exhaust chamber 21 is provided in a central portion of a bottom wall of the processing container 2.

The exhaust chamber 21 has, for example, a substantially cylindrical shape that protrudes downward. An exhaust flow path 22 is connected to the exhaust chamber 21, for example, on a side surface of the exhaust chamber 21. An exhauster 24 is connected to the exhaust flow path 22 via a pressure adjuster 23. The pressure adjuster 23 includes, for example, a pressure adjustment valve such as a butterfly valve. The exhaust flow path 22 is configured such that a pressure inside the processing chamber 2 can be reduced by the exhauster 24. A transfer port 25 is provided in a side surface of the processing container 2. The transfer port 25 is configured to be openable and closable by a gate valve 26. Loading/unloading of the substrate W between an interior of the processing container 2 and a transfer chamber (not illustrated) is performed via the transfer port 25.

A stage 3 configured to substantially hold the substrate W horizontally is provided in the processing container 2. The stage 3 has a substantially circular shape in plan view and is supported by a support 31. A substantially circular recess 32 is formed in a surface of the stage 3 to place therein the substrate W having a diameter of, for example, 300 mm. The recess 32 has an inner diameter slightly larger than the diameter of the substrate W (e.g., by about 1 mm to 4 mm). A depth of the recess 32 is substantially the same as, for example, a thickness of the substrate W. The stage 3 is made of a ceramic material such as aluminum nitride (AlN). In addition, the stage 3 may be made of a metallic material such as nickel (Ni). Instead of the recess 32, a guide ring configured to guide the substrate W may be provided at a peripheral edge of the surface of the stage 3.

A lower electrode 33 is embedded in the stage 3. A temperature adjustment mechanism 34 is embedded below the lower electrode 33. The temperature adjustment mechanism 34 adjusts a temperature of the substrate W mounted on the stage 3 to a set temperature based on a control signal from a controller 9. When the entire stage 3 is made of metal, the entire stage 3 functions as a lower electrode. Thus, it is unnecessary to embed the lower electrode 33 in the stage 3.

An RF power supply 35 is connected to the lower electrode 33 via a matcher 351. The RF power supply 35 applies low-frequency (LF) power having a frequency lower than that of an RF power supply 51, which will be described later, to the lower electrode 33. The low-frequency power generated by the RF power supply 35 is used as radio frequency power for bias that attracts ions to the substrate W. A frequency of the RF power supply 35 is, for example, 13.56 MHz.

The stage 3 is provided with a plurality of (for example, three) lifting pins 41 configured to hold and vertically move the substrate W placed on the stage 3. A material of the lifting pins 41 may be, for example, ceramic, such as alumina ($Al_2O_3$) or quartz. Lower ends of the lifting pins 41 are installed on a support plate 42. The support plate 42 is connected to a lifting mechanism 44 provided outside the processing container 2 via a lifting shaft 43.

The lifting mechanism 44 is installed, for example, below the exhaust chamber 21. A bellows 45 is provided between the lifting mechanism 44 and an opening 211 for the lifting shaft 43 formed in a lower surface of the exhaust chamber 21. The support plate 42 may have a shape that can be move vertically without interfering with the support 31 of the stage 3. The lifting pins 41 are configured to be move vertically between above the surface of the stage 3 and below the surface of the stage 3 by the lifting mechanism 44. In other words, the lifting pins 41 are configured to be capable of protruding from a top surface of the stage 3.

In addition, a lower end portion of the support 31 passes through the opening 212 in the exhaust chamber 21 and is supported by a lifting mechanism 46 via a lifting plate 47 disposed below the processing container 2. A bellows 48 is provided between a bottom of the exhaust chamber 21 and the lifting plate 47, and the airtightness inside the processing container 2 is maintained even by a vertical movement of the lifting plate 47.

By moving the lifting plate 47 vertically using the lifting mechanism 46, the stage 3 can be move vertically. As a result, a gap between the stage 3 and a gas supply 5 can be adjusted.

The gas supply 5 is provided on a ceiling wall 27 of the processing container 2 via an insulator 28. The gas supply 5 forms an upper electrode and faces the lower electrode 33. The RF power supply 51 is connected to the gas supply 5 via a matcher 511. The RF power supply 51 applies high-frequency power having a frequency higher than that of the RF power supply 35 to the upper electrode (the gas supply 5). The high-frequency power generated by the RF power supply 51 is used as radio frequency power for plasma generation required for film formation on the substrate W. The frequency of the RF power supply 51 is, for example, the very-high-frequency (VHF) band of 100 MHz to 300 MHz. An RF electric field is generated between the upper electrode (the gas supply 5) and the lower electrode 33 by supplying RF power from the RF power supply 51 to the upper electrode (the gas supply 5). The gas supply 5 includes a hollow gas diffusion chamber 52. In a bottom surface of the gas diffusion chamber 52, for example, a plurality of holes 53 configured to disperse and supply a processing gas into the processing container 2 is evenly arranged. A heater 54 is embedded in the gas supply 5, for example, above the gas diffusion chamber 52. The heater 54 is heated to a set temperature by being fed with power from a power supply (not illustrated) based on a control signal from the controller 9.

The gas diffusion chamber 52 is provided with a gas supply path 6. The gas supply path 6 in in communication with the gas diffusion chamber 52. A gas source 61 is connected to an upstream side of the gas supply path 6 via a gas line 62. The gas source 61 includes, for example, various processing gas sources, mass flow controllers, and valves (none of which are illustrated). Various processing gases include film forming gases containing carbon atoms (e.g., $CH_4$, $C_2H_2$, $C_3H_6$, and $C_2H_4$) used in the above-described method of forming the carbon-based film. Various processing gases may also include carrier gases (e.g., $H_2$, Ar, He, $O_2$, and $N_2$). Various processing gases are introduced into the gas diffusion chamber 52 from the gas source 61 via the gas line 62.

The substrate processing apparatus 1 includes the controller 9. The controller 9 is, for example, a computer, and includes, for example, a central processing unit (CPU), a random access memory (RAM), a read only memory (ROM), and an auxiliary storage device. The CPU operates based on a program stored in the ROM or the auxiliary storage device and controls operations of the substrate processing apparatus 1. The controller 9 may be provided either inside or outside the substrate processing apparatus 1. In the case where the controller 9 is provided outside the substrate processing apparatus 1, the controller 9 is capable of controlling the substrate processing apparatus 1 via a wired or wireless communication mechanism.

<Operation of Substrate Processing Apparatus 1>

Figure 2:
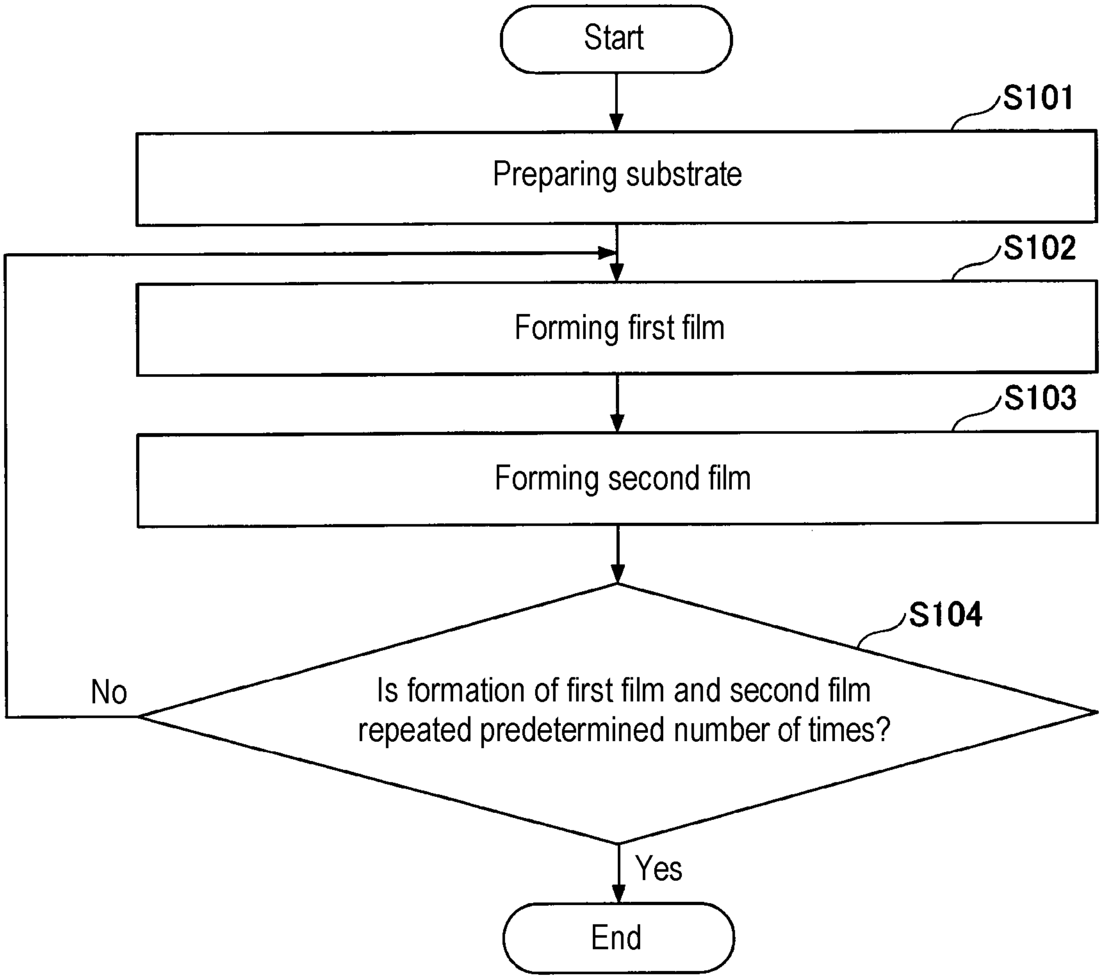
FIG. 2 is a flowchart illustrating an example of an operation of the substrate processing apparatus according to the embodiment.
Figure 3:
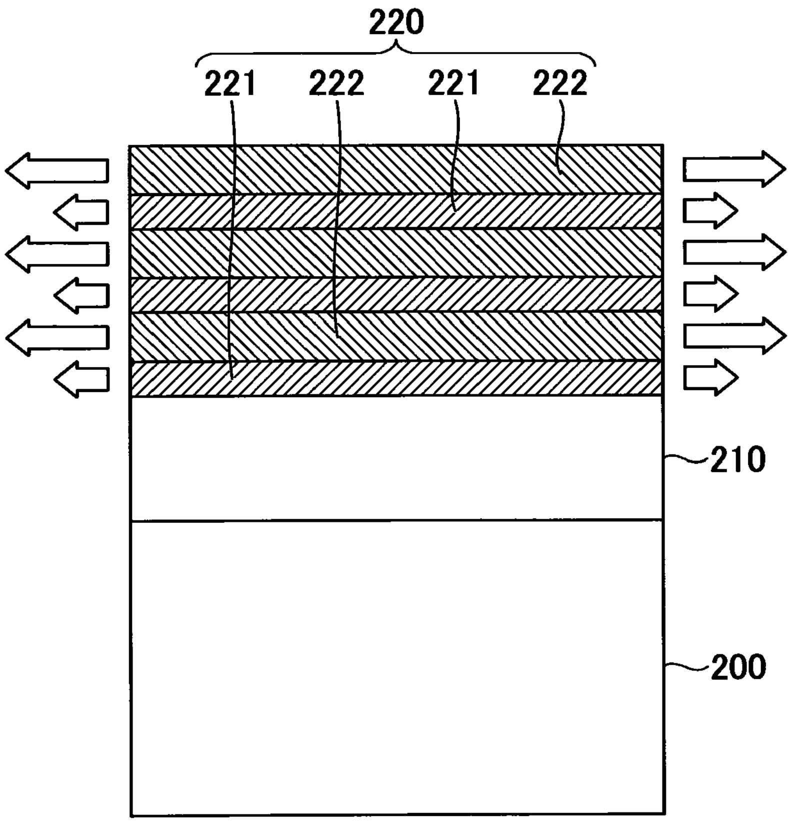
FIG. 3 is a schematic cross-sectional view of a wafer on which a stacked body is formed by the processing apparatus according to the embodiment.

Next, an example of an operation of the substrate processing apparatus 1 according to the present embodiment will be described with reference to FIGS. 2 and 3. FIG. 2 is a flow chart illustrating an example of an operation of the substrate processing apparatus 1 according to the present embodiment. FIG. 3 is a schematic cross-sectional view of the substrate W on which a stacked body of carbon-based films (e.g., a hard mask) 220 is formed by the substrate processing apparatus 1 according to the present embodiment.

In step S101, the controller 9 prepares the substrate W. The controller 9 controls a transfer apparatus (not illustrate) to place the substrate W on the stage 3 of the substrate processing apparatus 1. Here, the substrate W placed on the stage 3 has a target film 210 formed on a Si substrate 200 (see FIG. 3). In addition, the substrate processing apparatus 1 forms the stacked body 220 of carbon-based films on the target film 210 of the substrate W. The stacked body 220 of carbon-based films is used, for example, as a hard mask. The target film 210 is a film in which structures, such as trenches, channels, or holes, are formed by dry etching via a pattern formed in the stacked body 220. When the transfer apparatus retreats from the transfer port 25, the controller 9 closes the gate valve 26.

In step S102, the controller 9 forms a first film (a first carbon-based film) 221 having a first stress on the substrate W. In addition, a direction of the stress of the first film 221 (a direction of a first stress) is a compressive stress. Here, the first film 221 is a carbon film, for example, a polymer like carbon (PLC) film to be described later.

Here, the controller 9 controls the temperature adjustment mechanism 34 to set the temperature of the substrate W to be a predetermined temperature. In addition, the temperature adjustment mechanism 34 controls the pressure adjuster 23 and the exhauster 24 to set the interior of the processing container 2 to be a predetermined pressure. The controller 9 also controls the gas source 61 to supply a gas into the processing container 2. In addition, the controller 9 controls the RF power supply 51 to apply the high-frequency power (VHF) to the upper electrode (the gas supply 5). On the other hand, during the film formation of the first film 221, the RF power supply 35 does not apply the low-frequency power (LF) to the lower electrode 33.

An example of a recipe in step S102 is as follows.

Gap between stage and gas supply: 10 mm to 80 mm
Supply amount of $CH_4$ gas: 10 sccm to 500 sccm
Pressure in processing container: 5 mTorr to 100 mTorr
High-frequency power (VHF): 220 MHz, 100 W to 3,000 W
Low-frequency power (LF): 13.56 MHz, 0 W
Temperature of stage: 20 degrees C. to 200 degrees C.

In step S103, the controller 9 forms a second film (second carbon-based film) 222 having a second stress on the substrate W. In addition, a direction of the stress of the second film 222 (a direction of a second stress) is, for example, a compressive stress, which is the same as the direction of the stress of the first film 221 (the direction of the first stress). However, the stress of the first film 221 (first stress) and the stress of the second film 222 (second stress) differ from each other in intensity. Here, the second film 222 is a carbon film, such as a diamond like carbon (DLC) film to be described later.

Here, the controller 9 controls the temperature adjustment mechanism 34 to set the temperature of the substrate W to be a predetermined temperature. In addition, the temperature adjustment mechanism 34 controls the pressure adjuster 23 and the exhauster 24 to set the interior of the processing container 2 to be a predetermined pressure. The controller 9 also controls the gas source 61 to supply a gas into the processing container 2. In addition, the controller 9 controls the RF power supply 51 to apply the high-frequency power (VHF) to the upper electrode. In addition, the controller 9 controls the RF power supply 35 to apply the low-frequency power (LF) to the lower electrode.

In addition, an example of a recipe in step S103 is as follows.

Gap between stage and gas supply: 10 mm to 80 mm
Supply amount of $CH_4$ gas: 10 sccm to 500 sccm
Pressure in processing container: 5 mTorr to 100 mTorr
High-frequency power (VHF): 220 MHz, 100 W to 3,000 W
Low-frequency power (LF): 13.56 MHz, 100 W to 3,000 W
Temperature of stage: 20 degrees C. to 200 degrees C.

In step S104, the controller 9 determines whether film formation of the first film 221 and the second film 222 on the substrate W has been repeated a predetermined number of times. When the film formation has not been repeated the predetermined number of times (step S104, "No"), the process of the controller 9 returns to step S102, and the film formation of the first film 221 (S102) and the film formation of the second film 222 (step S103) are repeated. When the film formation has been repeated the predetermined number of times (step S104, "Yes"), the process of the controller 9 ends. As a result, the stacked body 220 in which the first films 221 and the second films 222 are alternately formed on the target film 210 of the substrate W is formed.

Figure 4A:
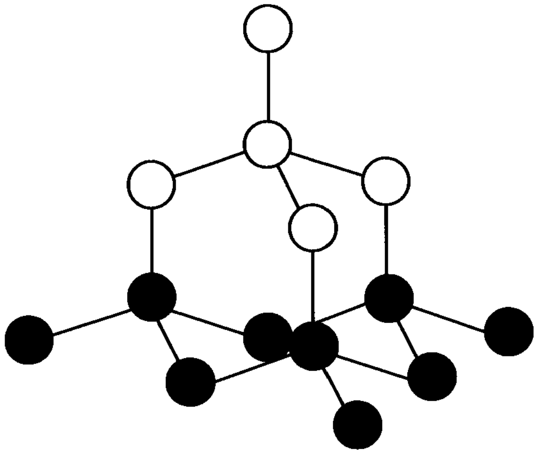
FIG. 4A is a schematic view illustrating a carbon bonding state.
Figure 4B:
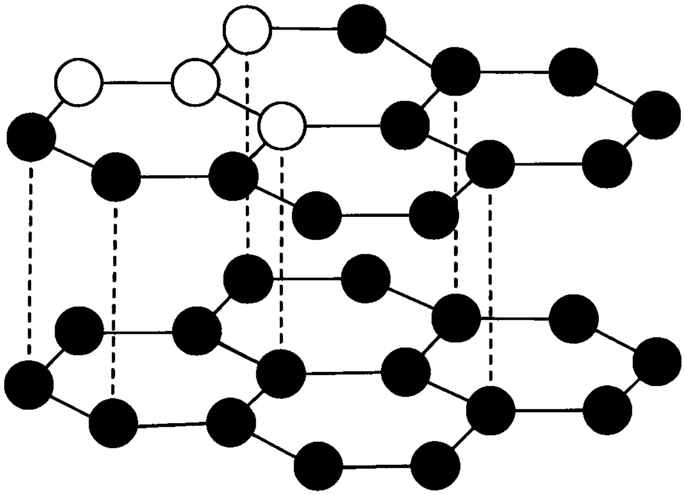
FIG. 4B is a schematic view illustrating a carbon bonding state.

Next, the PLC film as the first film 221 and the DLC film as the second film 222 will be further described with reference to FIGS. 3, 4A, and 4B. FIG. 4A and FIG. 4B are schematic views illustrating carbon bonding states. FIG. 4A is an example of a carbon skeletal structure formed by $sp^3$ bonds. FIG. 4B is an example of a carbon skeletal structure formed by $sp^2$ bonds. In addition, in FIGS. 4A and 4B, black circles and white circles indicate carbon. In addition, one bond structure is indicated by a white circle.

The DLC film is a carbon-based film having an irregular amorphous structure in which both $sp^3$ bonds illustrated in FIG. 4A and $sp^2$ bonds illustrated in FIG. 4B are mixed as a short-range order and which does not have a long-range order. The DLC film contains more $sp^3$ bonds than the PLC film. In addition, the DLC film contains less hydrogen (H) than the PLC film. In addition, the DLC film has a dry etching resistance. In addition, the DLC film has a strong compressive stress.

The PLC film is a carbon-based film having an irregular amorphous structure in which both $sp^3$ bonds illustrated in FIG. 4A and $sp^2$ bonds illustrated in FIG. 4B are mixed as a short-range order and which does not have a long-range order. The PLC film has less $sp^3$ than the DLC film. In addition, the PLC film contains more hydrogen (H) than the DLC film. In addition, the PLC film has a weaker compressive stress than the DLC film.

As illustrated in FIG. 3, the stacked body 220 formed by the substrate processing apparatus 1 according to the present embodiment is formed by alternately forming the PLC film (the first film 221) and the DLC film (the second film 222). Here, the film stresses in the first film 221 and the second film 222 are indicated by hollow arrows. The directions of the arrows indicate directions of the stresses in the films, and lengths of the arrows indicate intensities of the stresses.

By alternately forming the PLC film (the first film 221) having the weak compressive stress and the DLC film (the second film 222) having the strong compressive stress to form the stacked body 220, a stress of the stacked body 220 can be alleviated as compared with that in a case where a stacked body (hard mask) of carbon-based films is formed using the DLC films only.

In addition, since the stacked body 220 includes the DLC films (the second films 222) having a high dry etching resistance, a dry etching resistance of the stacked body 220 can be improved.

In addition, the lowermost film of the stacked body 220 may be the PLC film (the first film 221) having the weak compressive stress. Since the first film 221 in direct contact with the target film 210 has the weak compressive stress, adhesion between the target film 210 and the first film 221 can be enhanced. As a result, film detachment of the stacked body 220 can be prevented.

The stacked body 220 has been described as being an alternately stacked body in the order of the PLC film and the DLC film from the surface of the target film 210, but is not limited thereto. The stacked body 220 may be alternately stacked body in the order of the DLC film and the PLC film from the surface of the target film 210. The first DLC film in contact with the surface of the target film 210 may have a small film thickness. With this configuration, even when the first film 221 that is in direct contact with the target film 210 is the DLC film, the compressive stress can be suppressed and the adhesion between the target film 210 and the first film 221 can be enhanced by reducing the film thickness. As a result, film detachment of the stacked body 220 can be prevented.

Figure 5:
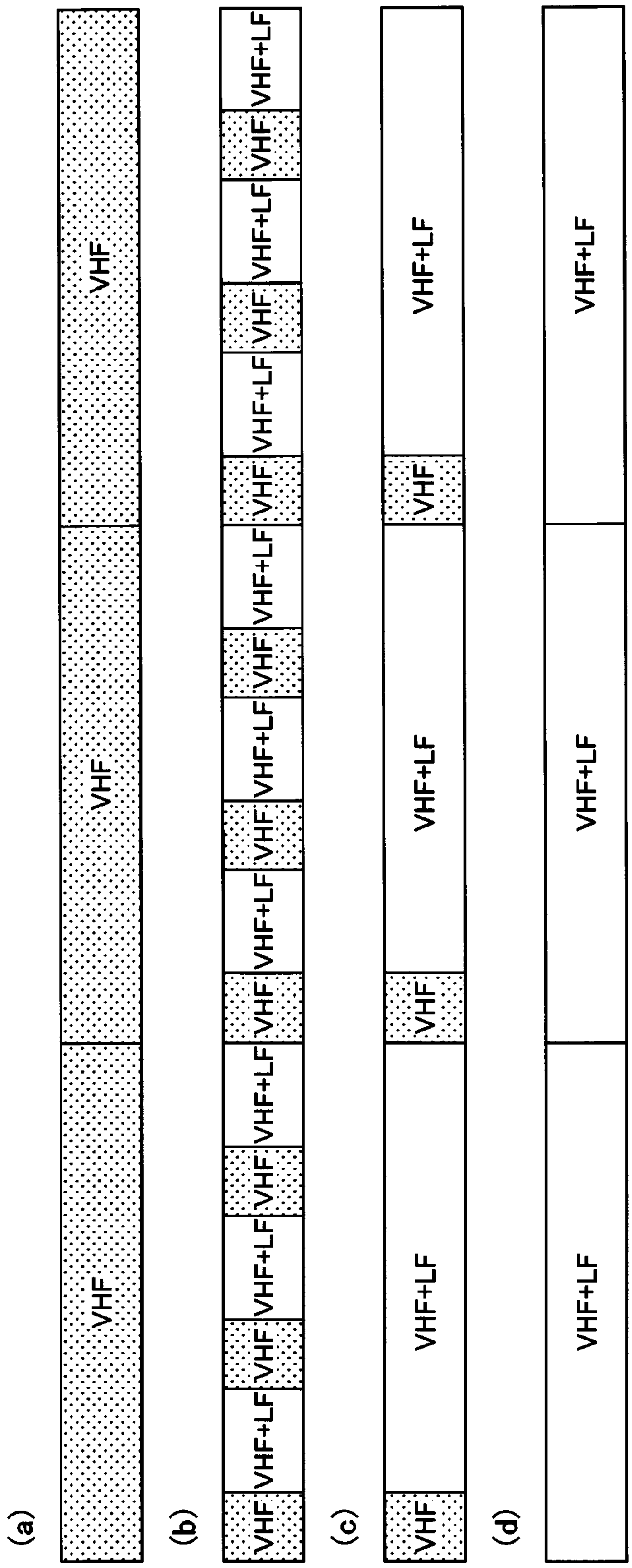
FIG. 5 illustrates examples of a time chart when forming a stacked body.

FIG. 5 illustrates examples of a time chart when forming the stacked body 220. Here, application of the high-frequency power (VHF) to the upper electrode (gas supply 5) by the RF power supply 51 and application of the low-frequency power (LF) to the lower electrode 33 by the RF power supply 35 will be described.

In (a) of FIG. 5, only the high-frequency power (VHF) is applied throughout a total film formation time. That is, a ratio of an application time of the high-frequency power (VHF) to the total film formation time is 100%. In this case, a PLC film is formed as the stacked body 220. On the other hand, in (d) of FIG. 5, the high-frequency power and the low-frequency power (VHF+LF) are applied throughout the total film formation time. That is, a ratio of an application time of the high-frequency power (VHF) only to the total film formation time is 0%. In this case, a DLC film is formed as the stacked body 220.

In (b) and (c) of FIG. 5, application of the high-frequency power (VHF) only and application of the high-frequency power and the low-frequency power (VHF+LF) are repeated. In addition, in (b) of FIG. 5, the ratio of the application time of the high-frequency power (VHF) to the total film formation time is 40%. In (c) of FIG. 5, the ratio of the application time of the high-frequency power (VHF) to the total film formation time is 13%. As a result, the stacked body 220 in which PLC films and DLC films are alternately formed is formed.

Figure 6:
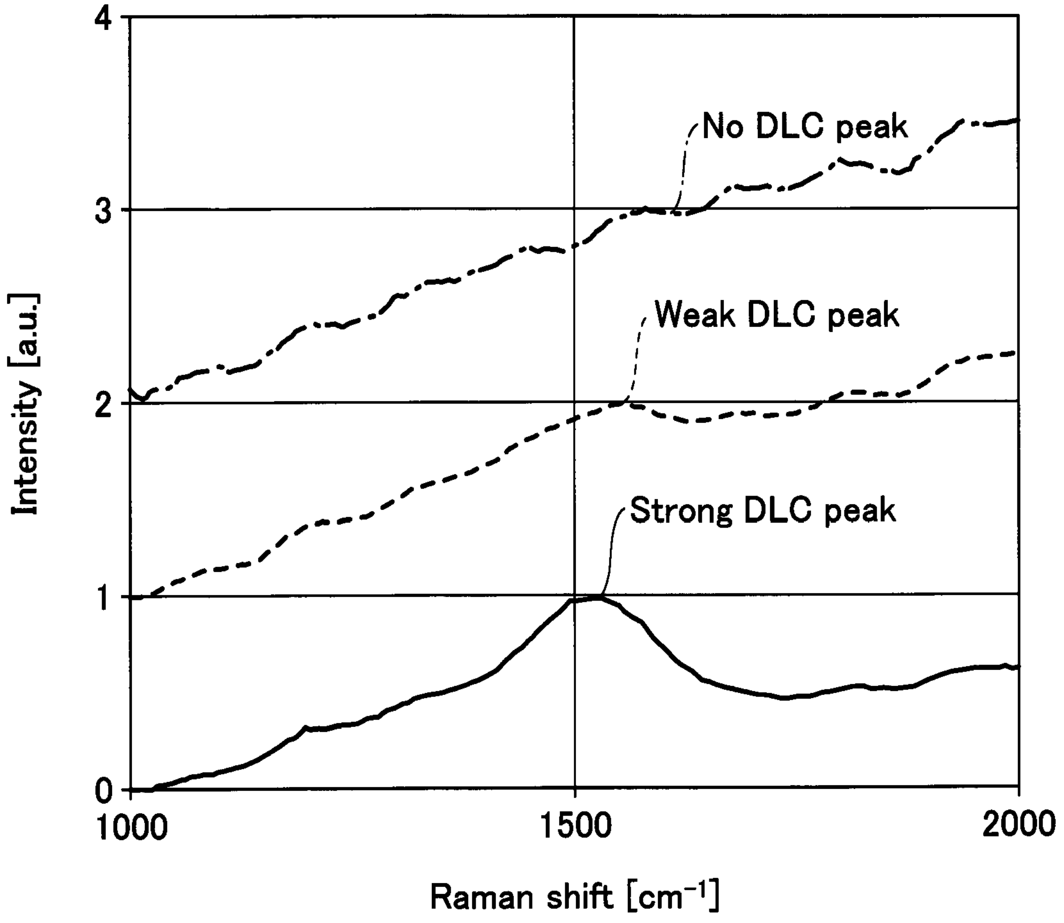
FIG. 6 is a graph illustrating examples of Raman spectra.

FIG. 6 is a graph illustrating examples of Raman spectra. Here, measurement results of Raman spectroscopy on the stacked body 220 formed according to the time charts illustrated in (a) to (c) of FIG. 5 are illustrated. The horizontal axis of FIG. 6 represents a Raman shift, and the vertical axis represents a scattering intensity. In addition, the solid line indicates a Raman spectrum of the stacked body 220 formed according to the time chart of (c) of FIG. 5, the dashed line indicates a Raman spectrum of the stacked body 220 formed according to the time chart of (b) of FIG. 5, and the alternate long and short dash line indicates a Raman spectrum of the stacked body 220 formed according to the time chart of (a) of FIG. 5.

In addition, an example of a recipe at the time of film formation of the measured stacked body 220 is as follows.

Gap between stage and gas supply: 60 mm
Supply amount of $CH_4$ gas: 200 sccm
Pressure in processing container: 20 m Torr
High-frequency power (VHF): 220 MHz, 1,000 W
Low-frequency power (LF): 13.5 MHz, 1000 W
Temperature of stage: 100 degrees C.

As illustrated in FIG. 6, no DLC peak was observed in the spectrum of the stacked body 220 in (a) of FIG. 5 indicated by the alternate long and short dash line. On the other hand, in the spectrum of the stacked body 220 in (b) of FIG. 5 indicated by the dashed line, a weak DLC peak was observed at a position from 1540 $cm^{-1}$ to 1543 $cm^{-1}$. In addition, in the spectrum of the stacked body 220 indicated by the solid line in (c) of FIG. 5, a strong DLC peak was observed at a position from 1540 $cm^{-1}$ to 1543 $cm^{-1}$.

As described above, a ratio of DLC in the stacked body 220 can be adjusted by controlling the application time of the high-frequency power and the low-frequency power (VHF+LF) with respect to the total film formation time. That is, the ratio of DLC in the stacked body 220 can be increased by increasing the ratio of the application time of the high-frequency power and the low-frequency power (VHF+LF).

Figure 7:
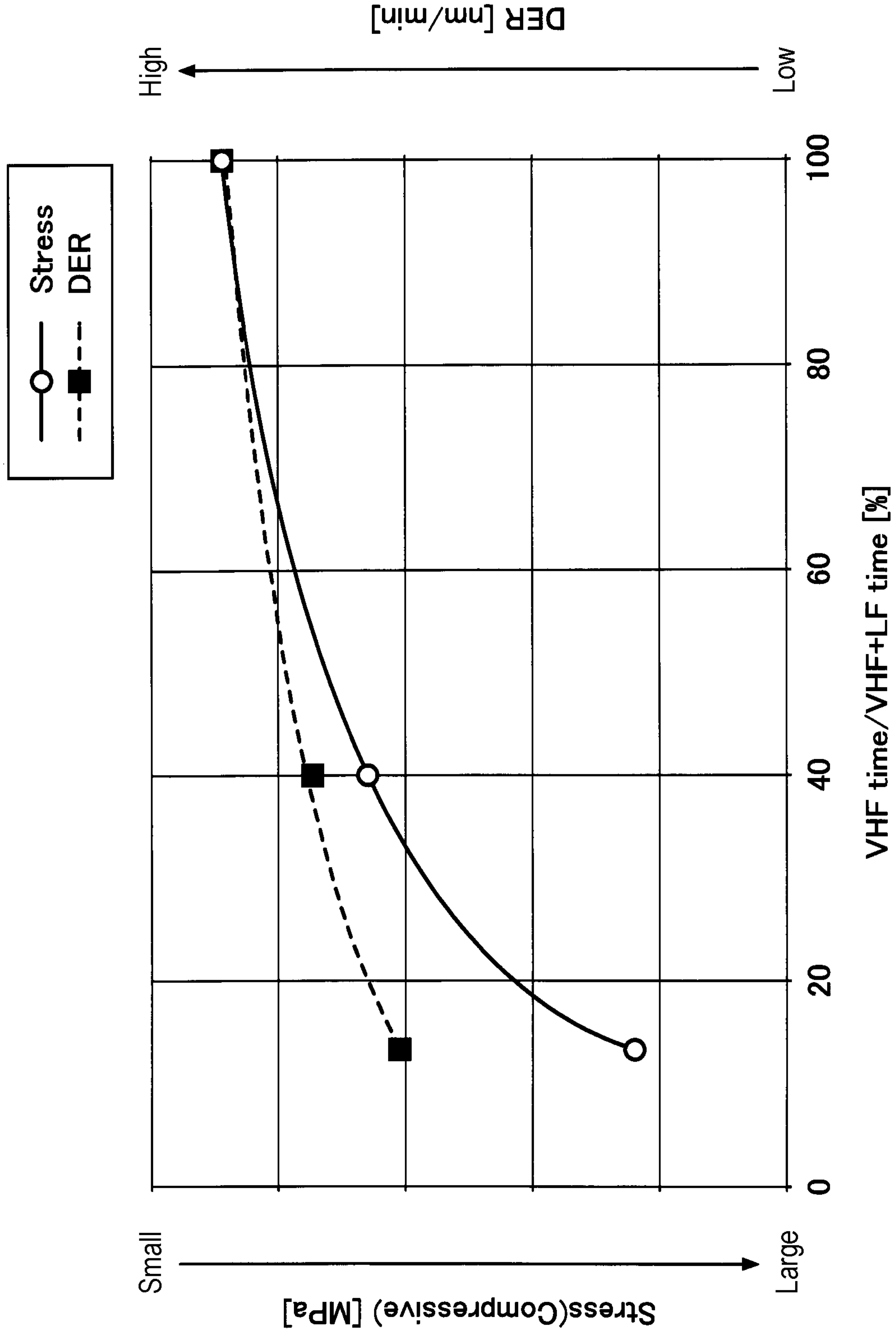
FIG. 7 is a graph illustrating examples of a stress and an etching resistance of a stacked body.

Next, the compressive stress and the dry etching resistance of the stacked body 220 formed according to the time charts illustrated in (a) to (c) of FIG. 5 will be further described with reference to FIG. 7. FIG. 7 is a graph showing examples of the stress and the etching resistance of the stacked body 220.

The first vertical axis on the left-hand side represents a stress. As for the stress, the direction of the compressive stress is assumed to be negative. In addition, results of the stress in the stacked body 220 formed according to the time charts illustrated in (a) to (c) of FIG. 5 are indicated by white circles, and a curve passing through respective points is indicated by a solid line.

The second vertical axis on the right-hand side represents dry etching rate (DER). In addition, results of the dry etching rate of the stacked body 220 formed according to the time charts illustrated in (a) to (c) of FIG. 5 are indicated by black squares, and a curve passing through respective points is indicated by a dashed line.

The horizontal axis represents the ratio of the application time of the high-frequency power and the low-frequency power (VHF+LF) to the total film formation time. In addition, the stacked body 220 formed according to the time chart as illustrated in (c) of FIG. 5 corresponds to the point of 13% on the horizontal axis, the stacked body 220 formed according to the time chart illustrated in (b) of FIG. 5 corresponds to the point of 40% on the horizontal axis, and the stacked body 220 formed according to the time chart illustrated in (a) of FIG. 5 corresponds to the point of 100% on the horizontal axis.

As illustrated in FIG. 7, the compressive stress of the stacked body 220 can be adjusted by controlling the application time of the high-frequency power and the low-frequency power (VHF+LF) with respect to the total film formation time. That is, as the ratio of the application time of the high-frequency power and the low-frequency power (VHF+LF) to the total film formation time increases, more DLC is formed in the stacked body 220 and the compressive stress increases. In addition, as the ratio of the application time of the high-frequency power (VHF) to the total film formation time increases, more PLC is formed in the stacked body 220 and the compressive stress decreases.

In addition, as the ratio of the application time of the high-frequency power and the low-frequency power (VHF+LF) to the total film formation time increases, more DLC is formed in the stacked body 220, and the dry etching rate decreases, in other words, the dry etching resistance of the stacked body 220 is improved.

As described above, with the stacked body 220 formed by the substrate processing apparatus 1 according to the present embodiment, the compressive stress can be alleviated more than the DLC film (see (d) of FIG. 5) while improving the dry etching resistance as compared with the conventional one. In addition, by controlling the bias power (low-frequency power (LF)), a ratio of the DLC films and the PLC films can be controlled, and the intensity of the compressive stress in the stacked body 220 to be formed can be controlled.

For example, by setting the ratio of the application time of the high-frequency power (VHF) to the total film formation time to be 13% to 80%, both the improvement of the dry etching resistance of the stacked body 220 and the alleviation of the compressive stress of the stacked body 220 can be achieved.

Figure 8:
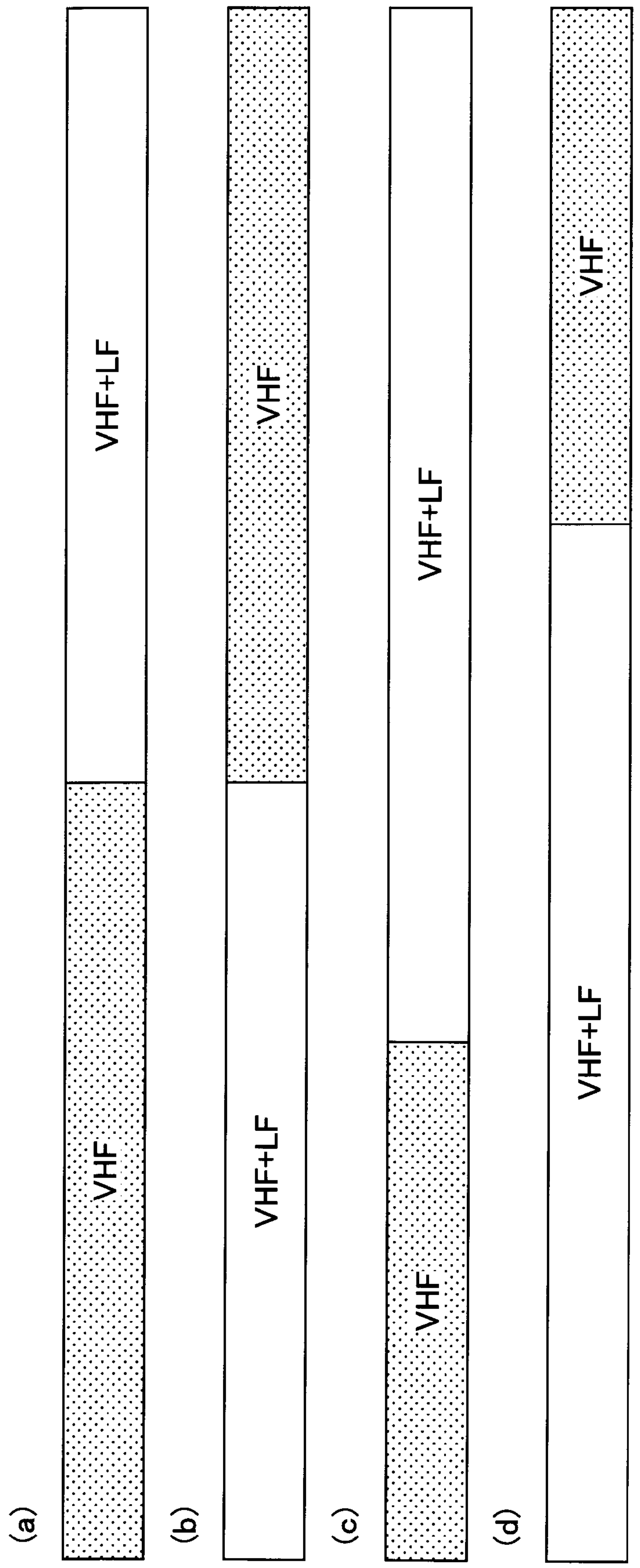
FIG. 8 illustrates other examples of a time chart when forming a stacked body.

In addition, the time charts for forming stacked body 220 are not limited to those illustrated in FIG. 5. FIG. 8 illustrates other examples of the time chart when forming stacked body 220.

In the example illustrated in (a) of FIG. 8, the ratio of the application time of the high-frequency power (VHF) to the total film formation time is set to be 50%, and after applying the high-frequency power (VHF), the high-frequency power and the low-frequency power (VHF+LF) are applied. In the example illustrated in (b) of FIG. 8, the ratio of the application time of the high-frequency power (VHF) to the total film formation time is set to be 50%, and after applying the high-frequency power and the low frequency power (VHF+LF), the high-frequency power (VHF) is applied. In the example illustrated in (c) of FIG. 8, the ratio of the application time of the high-frequency power (VHF) to the total film formation time is set to be 30%, and after applying the high-frequency power (VHF), the high-frequency power and the low-frequency power (VHF+LF) are applied. In the example illustrated in (d) of FIG. 8, the ratio of the application time of the high-frequency power (VHF) to the total film formation time is set to be 30%, and after applying the high-frequency power and the low frequency power (VHF+LF), the high-frequency power (VHF) is applied.

Although the substrate processing method by the substrate processing apparatus 1 has been described above, the present disclosure is not limited to the above-described embodiment or the like, and various modifications and improvements can be made within the scope of present disclosure described in the claims.

In addition, although it has been described that switching periods of the applied voltages in FIG. 5 are constant, the present disclosure is not limited thereto. During the film forming process of the stacked body 220, the ratio of the application time of the high-frequency power (VHF) may be changed. With this configuration, for example, the stacked body 220 can be formed such that a lower layer side thereof contains less DLC and an upper layer side thereof contains more DLC. As a result, the dry etching resistance of the upper layer side of the stacked body 220, which is exposed to an etching gas during dry etching, can be improved, and the compressive stress of the entire stacked body 220 can be alleviated.

In the present embodiment, although it has been described that a stress intensity in a formed carbon-based film is controlled by controlling the bias power (the low-frequency power (LF)), the present disclosure is not limited thereto.

For example, when forming the first film 221 and the second film 222, the gap between the stage 3 and the gas supply 5 may be changed by controlling the lifting mechanism 46. By changing the gap between the stage 3 and the gas supply 5, the ratio of $sp^3$ bonds and $sp^2$ bonds in the formed carbon-based film is changed. With this configuration, the DLC films and the PLC films to be alternately stacked by moving the stage 3 vertically.

The present application claims priority based on Japanese Patent Application No. 2021-26704 filed on Feb. 22, 2021, the disclosure of which is incorporated herein in its entirety by reference.

EXPLANATION OF REFERENCE NUMERALS

W: substrate, 1: substrate processing apparatus, 2: processing container, 3: stage, 5: gas supply (upper electrode), 6: gas supply path, 9: controller, 33: lower electrode, 35: RF power supply, 51: RF power supply, 200: Si substrate, 210: target film, 220: stacked body (hard mask), 221: first film, 222: second film

What is claimed is:

1. A substrate processing method of forming a carbon-based film on a substrate, comprising:
- a process of placing the substrate on a stage;
- a first film forming process of forming a first carbon-based film having a first stress;
- a second film forming process of forming a second carbon-based film having a second stress; and
- a third film forming process of repeating the first film forming process and the second film forming process to form a stacked body of the first carbon-based film and the second carbon-based film,
- wherein the first stress and the second stress are compressive stresses, and the first stress and the second stress have different intensities,
- wherein in the third film forming process, applying bias power to the stage and stopping the application of the bias power to the stage are alternately repeated, and
- wherein a stress intensity in the stacked body is adjusted by controlling a ratio of a total application time of the bias power to the stage with respect to a total formation time of the stacked body.

2. The substrate processing method of claim 1, wherein a stress intensity in the first carbon-based film is smaller than a stress intensity in the second carbon-based film.

3. The substrate processing method of claim 2, wherein an intensity of the first stress and an intensity of the second stress are controlled by the application of the bias power to a lower electrode of the stage.

4. The substrate processing method of claim 3, wherein in the first film forming process, the bias power is not applied, and
- wherein in the second film forming process, the bias power is applied.

5. The substrate processing method of claim 4, wherein a film in contact with the substrate is the first carbon-based film.

6. The substrate processing method of claim 5, wherein the stress intensity in the stacked body is controlled by a ratio of the first carbon-based film and the second carbon-based film.

7. The substrate processing method of claim 6, wherein in the third film forming process, the first film forming process and the second film forming process are alternately repeated.

8. The substrate processing method of claim 7, wherein the carbon-based film is a carbon film.

9. The substrate processing method of claim 8, wherein the stacked body is a hard mask.

10. The substrate processing method of claim 1, wherein an intensity of the first stress and an intensity of the second stress are controlled by the application of the bias power to a lower electrode of the stage.

11. The substrate processing method of claim 1, wherein a film in contact with the substrate is the first carbon-based film.

12. The substrate processing method of claim 1, wherein a film in contact with the substrate is the second carbon-based film, and
- wherein the second carbon-based film in contact with the substrate has a thickness smaller than other second carbon-based films in the stacked body.

13. The substrate processing method of claim 1, wherein the stress intensity in the stacked body is controlled by a ratio of the first carbon-based film and the second carbon-based film.

14. The substrate processing method of claim 1, wherein in the third film forming process, the first film forming process and the second film forming process are alternately repeated.

15. The substrate processing method of claim 1, wherein the carbon-based film is a carbon film.

16. The substrate processing method of claim 1, wherein the stacked body is a hard mask.

17. A substrate processing apparatus comprising:

a processing container;

a stage disposed in the processing container and configured to place a substrate on the stage;

a gas supply configured to supply a film forming gas into the processing container;

a power supply configured to apply bias power to the stage; and a controller, wherein the controller is configured to execute:

a first film forming process of forming a first carbon-based film having a first stress by supplying the film forming gas into the processing container from the gas supply;

a second film forming process of forming a second carbon-based film having a second stress by supplying the film forming gas into the processing container from the gas supply; and a third film forming process of repeating the first film forming process and the second film forming process to form a stacked body of the first carbon-based film and the second carbon-based film, and wherein the controller is further configured to perform a control such that the first stress and the second stress are compressive stresses, and the first stress and the second stress have different intensities, wherein the controller is further configured to alternately repeat, in the third film forming process, applying bias power to the stage by the power supply and stopping the application the bias power to the stage, and wherein the controller is further configured to adjust a stress intensity in the stacked body by controlling a ratio of a total application time of the bias power to the stage with respect to a total formation time of the stacked body.

18. The substrate processing apparatus of claim 17, wherein the controller is further configured to perform a control such that the bias power is not applied in the first film forming process and the bias power is applied in the second film forming process.

* * * * *